(12) United States Patent
Skolaut (10) Patent No.: US 11,881,383 B2
(45) Date of Patent: Jan. 23, 2024

(54) CONTROL CIRCUIT FOR A DIELECTRIC BARRIER DISCHARGE (DBD) DISK IN A THREE-DIMENSIONAL PRINTER

(71) Applicant: Essentium, Inc., Pflugerville, TX (US)

(72) Inventor: Matthew Skolaut, Houston, TX (US)

(73) Assignee: ESSENTIUM IPCO, LLC, Pflugerville, TX (US)

( * ) Notice: Subject to any disclaimer, the term of this patent is extended or adjusted under 35 U.S.C. 154(b) by 173 days.

(21) Appl. No.: 17/402,786

(22) Filed: Aug. 16, 2021

(65) Prior Publication Data

US 2023/0051539 A1    Feb. 16, 2023

(51) Int. Cl.
| | |
|---|---|
| H01J 37/32 | (2006.01) |
| B29C 64/264 | (2017.01) |
| H05H 1/24 | (2006.01) |
| B33Y 30/00 | (2015.01) |

(52) U.S. Cl.
CPC ...... *H01J 37/32348* (2013.01); *B29C 64/264* (2017.08); *H05H 1/2425* (2021.05); *B33Y 30/00* (2014.12)

(58) Field of Classification Search
CPC .......... H05H 2242/20–24; H05H 7/02; H05H 2007/022–027; H05H 1/2425; H05H 2242/22; H01J 37/32348; B29C 64/264; B29C 64/118; B29C 64/295; B33Y 30/00; B33Y 10/00
See application file for complete search history.

(56) References Cited

U.S. PATENT DOCUMENTS

| | | | |
|---|---|---|---|
| 7,135,653 B2 | 11/2006 | Routberg et al. | |
| 8,253,057 B1 | 8/2012 | Hunt | |
| 2008/0297499 A1* | 12/2008 | Chang ................. | H02M 5/4585 |
| | | | 345/212 |

(Continued)

FOREIGN PATENT DOCUMENTS

CN        107071956 A  *  8/2017  ........... H04B 10/116

OTHER PUBLICATIONS

Amjad, M., & Salam, Z. (2014). Design and implementation of a high-frequency LC-based half-bridge resonant converter for dielectric barrier discharge ozone generator. IET Power Electronics, 7(9), 2403-2411. doi:10.1049/iet-pel.2013.0511.

(Continued)

*Primary Examiner* — Abdullah A Riyami
*Assistant Examiner* — Syed M Kaiser
(74) *Attorney, Agent, or Firm* — Vivacqua Crane, PLLC (57) ABSTRACT

A control circuit for generating a primary alternating current (AC) voltage signal provided to a dielectric barrier discharge (DBD) disk of a three-dimensional printer includes a switching regulator receiving a direct current (DC) voltage signal. The switching regulator modulates the DC voltage signal based on a variable duty cycle to create a modulated DC signal. The control circuit also includes a modulation circuit in electrical communication with the switching regulator. The modulation circuit introduces a frequency component to the modulated DC signal, where the primary AC voltage signal includes a variable duty cycle and a set frequency, and the frequency component introduced into the modulated DC signal is representative of the set frequency of the primary AC voltage.

20 Claims, 7 Drawing Sheets

(56) References Cited

U.S. PATENT DOCUMENTS

| | | | |
|---|---|---|---|
| 2009/0184662 A1* | 7/2009 | Given | H05B 39/044 |
| | | | 315/294 |
| 2011/0068704 A1* | 3/2011 | McKinney | H05B 45/355 |
| | | | 315/210 |
| 2015/0271906 A1* | 9/2015 | Kamata | H02M 3/335 |
| | | | 315/111.21 |
| 2016/0271874 A1 | 9/2016 | Tsai et al. | |
| 2017/0127506 A1* | 5/2017 | Ghomi Marzdashty | |
| | | | H05H 1/2406 |
| 2019/0065000 A1* | 2/2019 | Kim | G06F 3/04184 |

OTHER PUBLICATIONS

Wang, C., & He, X. (2006). Preparation of hydrophobic coating on glass surface by dielectric barrier discharge using a 16kHz power supply. Applied Surface Science, 252(23), 8348-8351. doi: 10.1016/j.apsusc.2005.11.042.

International Searching Authority. International Search Report and Written Opinion for PCT Application No. PCT/US2022/074913, dated Nov. 7, 2022, pp. 1-6.

* cited by examiner

CONTROL CIRCUIT FOR A DIELECTRIC BARRIER DISCHARGE (DBD) DISK IN A THREE-DIMENSIONAL PRINTER

FIELD

The present disclosure is directed to a control circuit for generating an alternating current (AC) voltage signal for a dielectric barrier discharge (DBD) disk that generates plasma in a three-dimensional printer. More specifically, the present disclosure is directed towards a control circuit that generates an AC voltage signal having a set frequency and a variable duty cycle to adjust an amount of power provided to a DBD disk that generates plasma in a three-dimensional printer.

BACKGROUND

The statements in this section merely provide background information related to the present disclosure and may or may not constitute prior art.

Three-dimensional printing, which is also referred to as additive manufacturing, creates printed components based on computer models. In one example, a printed component may be created by depositing a feedstock, such as a thermoplastic filament, through a heated nozzle in successive layers upon a base plate. Additive manufacturing techniques may be used to create large, relatively complex components. However, since additive manufacturing techniques involve building parts layer by layer, the resulting printed components exhibit an anisotropic tensile strength. That is, the tensile strength measured in the build direction of the printed component may be significantly less when compared to the tensile strength measured in a direction perpendicular to the build direction.

In one approach to improve the tensile strength of a printed component in the build direction, electromagnetic energy may be used to fuse the successive layers of the printed component together. Specifically, a dielectric barrier discharge (DBD) electrode that generates plasma is included as part of the three-dimensional printer. The plasma provides a conductive pathway between a point of extrusion located below the nozzle and the printed component. The conductive pathway enables heating of the printed component, or at least portions of the printed component proximate to the point of extrusion. The heat welds successive layers of the printed component together, thereby improving the tensile strength in the build direction. The DBD plasma electrode requires a high voltage alternating current (AC) signal, which may range from about five to about ten kilovolts, to generate the plasma. However, the circuits currently available that generate the required power to generate the plasma may require large amounts of packaging space, are complex, and are relatively difficult to control.

Thus, while current DBD plasma electrodes used in additive manufacturing techniques achieve their intended purpose, there is a need for a relatively simple and compact circuit for generating and controlling the high voltage AC signal required by the DBD plasma electrode.

SUMMARY

According to several aspects, a control circuit for generating a primary alternating current (AC) voltage signal provided to a dielectric barrier discharge (DBD) disk of a three-dimensional printer is disclosed. The control circuit includes a switching regulator receiving a direct current (DC) voltage signal, wherein the switching regulator modulates the DC voltage signal based on a variable duty cycle to create a modulated DC signal. The control circuit also includes a modulation circuit in electrical communication with the switching regulator. The modulation circuit introduces a frequency component to the modulated DC signal, wherein the primary AC voltage signal includes a variable duty cycle and a set frequency. The frequency component introduced into the modulated DC signal is representative of the set frequency of the primary AC voltage.

In another aspect, a three-dimensional printer having a DBD disk configured to generate plasma is disclosed. The three-dimensional printer includes a flyback transformer in electrical communication with the DBD disk and a control circuit configured to generate a primary AC voltage signal sent to the flyback transformer. The flyback transformer transforms the primary AC voltage signal into a secondary AC voltage signal that is sent to the DBD disk. The control circuit includes a switching regulator receiving a DC voltage signal. The switching regulator modulates the DC voltage signal based on a variable duty cycle to create a modulated DC signal. The control circuit also includes a modulation circuit in electrical communication with the switching regulator. The modulation circuit introduces a frequency component to the modulated DC signal, where the primary AC voltage signal includes a variable duty cycle and a set frequency. The frequency component introduced into the modulated DC signal is representative of the set frequency of the primary AC voltage.

Further areas of applicability will become apparent from the description provided herein. It should be understood that the description and specific examples are intended for purposes of illustration only and are not intended to limit the scope of the present disclosure.

BRIEF DESCRIPTION OF DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
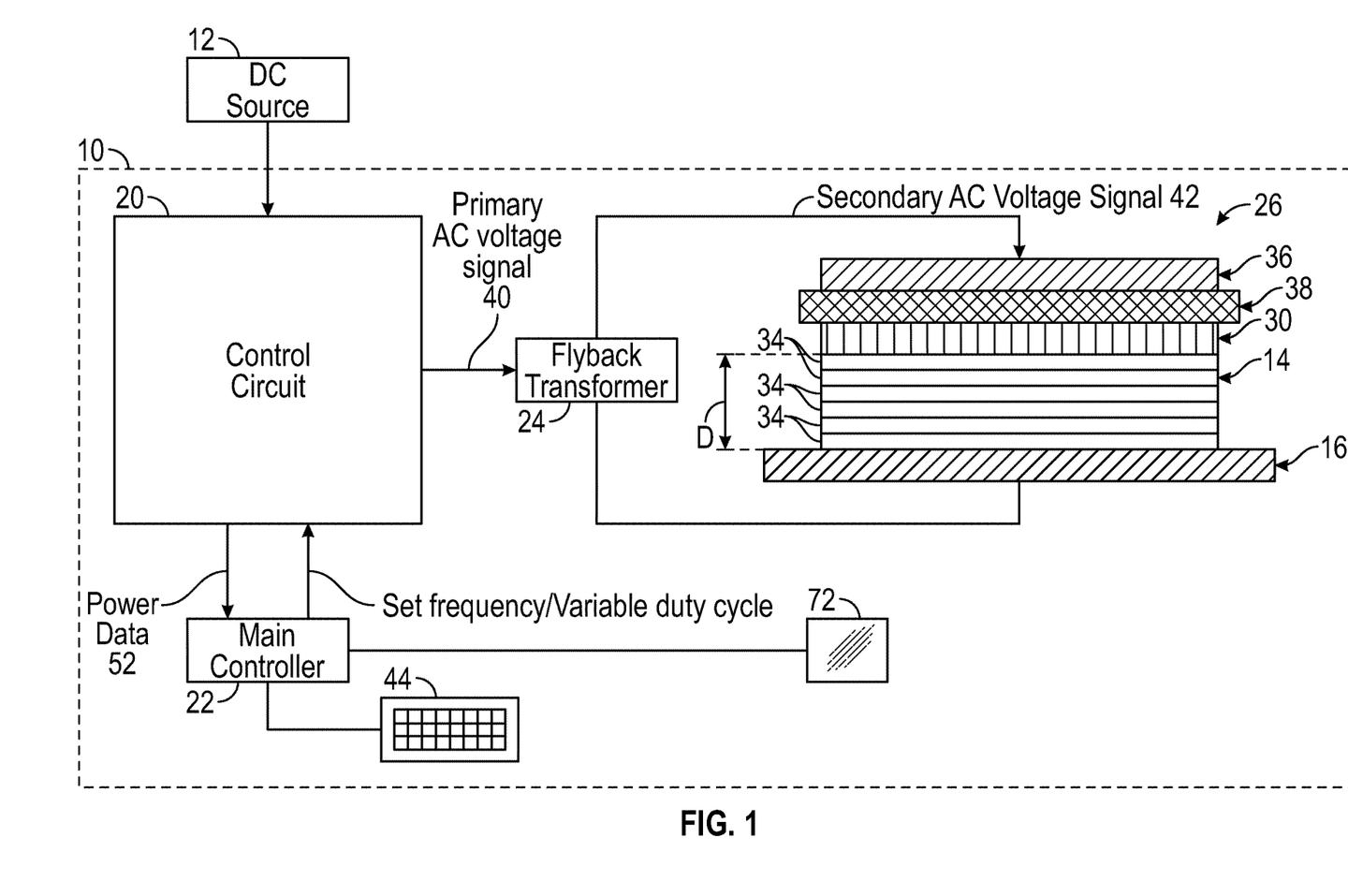
FIG. 1 is a schematic diagram of a three-dimensional printer including a control circuit and a DBD disk, according to an exemplary embodiment.

The present disclosure is directed to a control circuit for generating the power required by a dielectric barrier discharge (DBD) disk that generates plasma in a three-dimensional printer. Referring now to FIG. 1, a schematic diagram of a three-dimensional printer 10 electrically connected to a direct current (DC) source 12 is illustrated. As seen in FIG. 1, the three-dimensional printer 10 creates printed components 14 upon a bed plate 16. The three-dimensional printer 10 includes a control circuit 20, a main controller 22, a flyback transformer 24, and a DBD disk 26. The DBD disk 26 includes an electrode 36 and a dielectric insulator 38. The DBD disk 26 is configured to generate a plasma 30 that creates a conductive pathway that enables heating of the printed component 14. The heat welds successive layers 34 of the printed component 14 together, thereby improving the tensile strength of the printed component 14 in the build direction D.

The DBD disk 26 requires a high voltage alternating current (AC) voltage signal to generate the plasma 30. In one non-limiting embodiment, the DBD disk 26 requires a high voltage AC voltage signal ranging from about five to about ten kilovolts, however, it is to be appreciated that other ranges may be used as well. As explained below, the control circuit 20 is configured to generate a primary AC voltage signal 40 having a set frequency and a variable duty cycle that is provided to the DBD disk 26. Specifically, the primary AC voltage signal 40 is first sent to the flyback transformer 24, which is step-up flyback transformer, that transfers the primary AC voltage signal 40 to the DBD disk 26 as a secondary AC voltage signal 42. The value of the primary AC voltage signal 40 is less than a value of the secondary AC voltage signal 42 sent directly to the DBD disk 26. For example, in one embodiment, the primary AC voltage signal 40 is a twenty-four Volt signal, and the secondary AC voltage signal 42 ranges from about five to about ten Kilovolts.

The main controller 22 is in electrical communication with a controller 50 (shown in FIG. 2) that is part of the control circuit 20. The main controller 22 is configured to control operation of the three-dimensional printer 10 and send commands to the controller 50 regarding operation of the control circuit 20. Specifically, the main controller 22 sends the set frequency and the variable duty cycle of the primary AC voltage signal 40 to the controller 50. The amount of power provided to the DBD disk 26 is based on both the set frequency and the variable duty cycle of the primary AC voltage signal 40, where the set frequency defines a maximum amount of power provided to the DBD disk 26 by the primary AC voltage signal 40, and the variable duty cycle provides fine or granular control over the amount of power provided the DBD disk 26 by the primary AC voltage signal 40.

The controllers 22, 50 may refer to, or be part of an electronic circuit, a combinational logic circuit, a field programmable gate array (FPGA), a processor (shared, dedicated, or group) that executes code, or a combination of some or all of the above, such as in a system-on-chip. Additionally, the controllers may be microprocessor-based such as a computer having a at least one processor, memory (RAM and/or ROM), and associated input and output buses. The processor may operate under the control of an operating system that resides in memory. The operating system may manage computer resources so that computer program code embodied as one or more computer software applications, such as an application residing in memory, may have instructions executed by the processor. In an alternative embodiment, the processor may execute the application directly, in which case the operating system may be omitted.

The set frequency of the primary AC voltage signal 40 is a static value that remains constant for a print cycle of the three-dimensional printer 10, where a single printed component is created during each print cycle. In one embodiment, the set frequency may be entered into the main controller 50 by a machine operator using an input device 44 such as a keyboard. In the alternative, the set frequency may be a pre-programmed value.

The variable duty cycle is adjustable during a print cycle of the three-dimensional printer 10. Specifically, the variable duty cycle is adjusted to vary an amount of power provided to the DBD disk 26 based on the primary AC voltage signal 40 during a particular print cycle. The amount of power is varied during a particular print cycle based on a specific amount of Joule heating that is required to weld the successive layers 34 of the printed component 14 together. The amount of power is adjusted based on the geometry of the printed component 14, where smaller cross-sectional areas of the printed component 14 require less Joule heating and larger cross-sectional areas of the printed component 14 require more Joule heating. The variable duty cycle provides fine control over the amount of power provided to the DBD disk 26, which is required to accommodate the geometry of the printed component 14 during the print cycle. The variable duty cycle may be pre-programmed or, alternatively, manually entered into the input device 44 by a machine operator during a print cycle. The variable duty cycle is expressed by a pulse width modulation (PWM) signal including a percentage and a PWM frequency.

Figure 2:
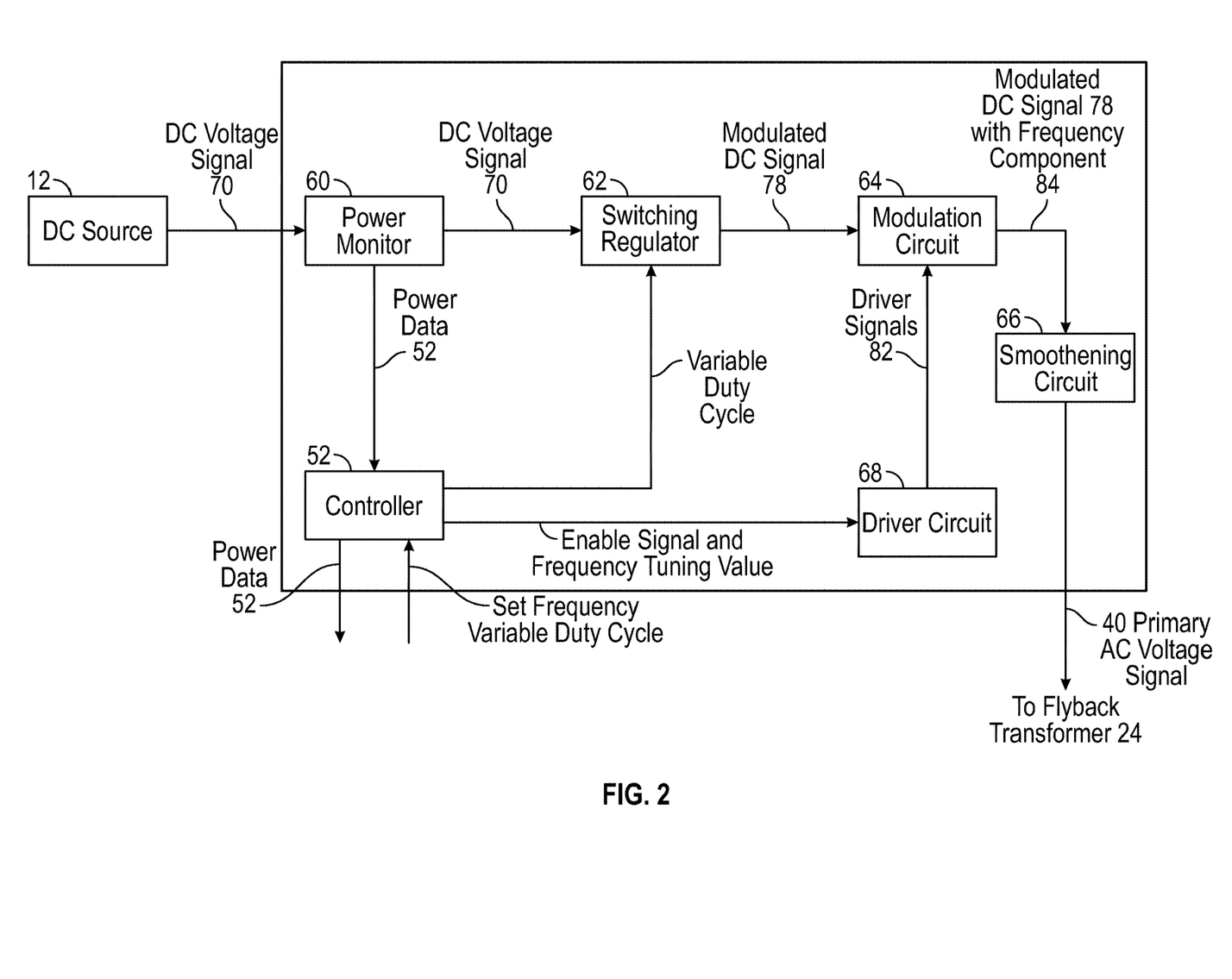
FIG. 2 is a schematic diagram of the control circuit shown in FIG. 1, according to an exemplary embodiment.

FIG. 2 is a schematic illustration of the control circuit 20 shown in FIG. 1. Referring to FIG. 2, the control circuit 20 includes the controller 50, a power monitor 60, a switching regulator 62, a modulation circuit 64, a smoothening circuit 66, and a driver circuit 68. The controller 50 is in electronic communication with the power monitor 60, the switching regulator 62, and the driver circuit 68. The control circuit 20 receives as input a DC voltage signal 70 from the DC source 12. In one non-limiting embodiment, the DC voltage signal 70 is about 24 Volts, however, other values may be used as well. The power monitor 60 of the control circuit 20 receives the DC voltage signal 70 from the DC source 12 and determines power data 52 based on the DC voltage signal 70. In an embodiment, the power data 52 indicates an amount of power, which may be measured in Watts, of the DC voltage signal 70. However, it is to be appreciated that the power data 52 may indicate other information about the DC voltage signal 70 as well.

Referring to FIGS. 1 and 2, the controller 50 sends the power data 52 to the main controller 22. In an embodiment, the three-dimensional printer 10 includes a display device 72, such as a screen, for displaying the power data 52. The display device 72 may be viewed by a machine operator. In one embodiment, the machine operator may manually adjust the variable duty cycle of the primary AC voltage signal 40 using the input device 44 based on the power data 52 viewed on the display device 72. As explained below, the control circuit 20 generates the primary voltage AC signal 40 based on the set frequency and the variable duty cycle received from the main controller 22. Although two separate controllers 22, 50 are shown in the figures, it is to be appreciated that the figures are merely exemplary in nature and in another embodiment a single controller may be used as well.

Figure 3:
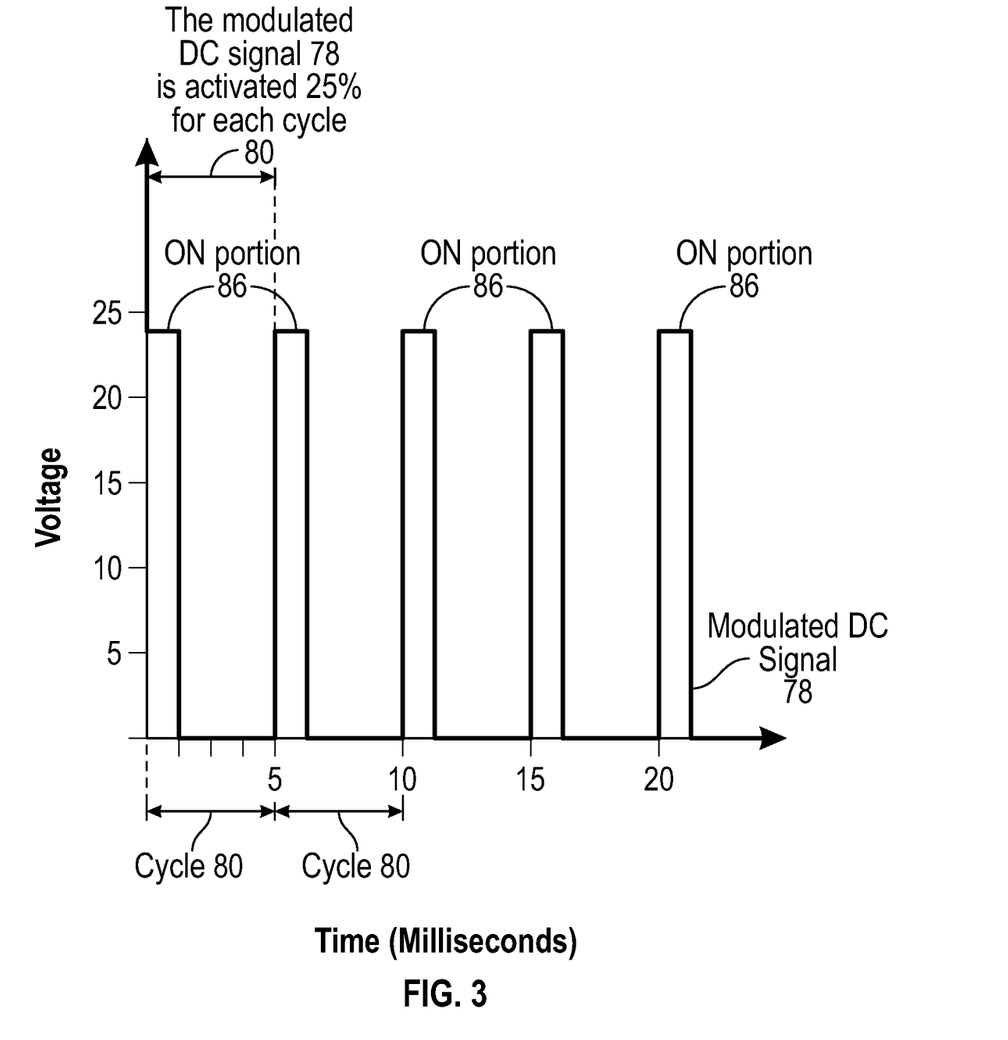
FIG. 3 is a graph illustrating an exemplary modulated DC signal that is generated by a switching regulating that is part of the control circuit shown in FIG. 2, according to an exemplary embodiment.

Referring specifically to FIG. 2, the switching regulator 62 receives as input the DC voltage signal 70 from the DC source 12 and a value for the variable duty cycle from the controller 50. The switching regulator 62 may be any device configured to modulate the DC voltage signal 70 such as, for example, a power metal-oxide-semiconductor field-effect transistor (MOSFET) or a bipolar junction transistor (BJT). The switching regulator 62 modulates the DC voltage signal 70 based on the variable duty cycle to create a modulated DC signal 78, which is shown in FIG. 3. Referring to FIGS. 2 and 3, the modulated DC signal 78 is a PWM signal including a percentage and a PWM frequency. In the example as shown in FIG. 3, the DC voltage signal 70 is 24 Volts and the modulated DC signal 78 includes a percentage of 25% and a PWM frequency of 200 Hertz. Thus, since 200 Hertz is equal to 5 milliseconds, each cycle 80 of the modulated DC signal FIG. 3 illustrates the modulated DC signal 78 being activated 25% of the time during each cycle 80.

Referring back to FIG. 2, the controller 50 sends an enable signal and a frequency tuning value to the driver circuit 68. As seen in FIG. 2, the driver circuit 68 is in electronic communication with the modulation circuit 64. The driver circuit 68 includes control logic or circuitry for creating driving signals 82 that are sent to the modulation circuit 64. The enable signal instructs the modulation circuit 64 to either start or stop operation. The controller 50 determines the frequency tuning value based on the set frequency of the primary AC voltage signal 40 received from the main controller 22 (seen in FIG. 1). The frequency tuning value instructs the driver circuit 68 to generate the driving signals 82 that cause the modulation circuit 64 to introduce a frequency component 84 (seen in FIG. 4) to the modulated DC signal 78, where the frequency component 84 is representative of the set frequency of the primary AC voltage signal 40.

Figure 4:
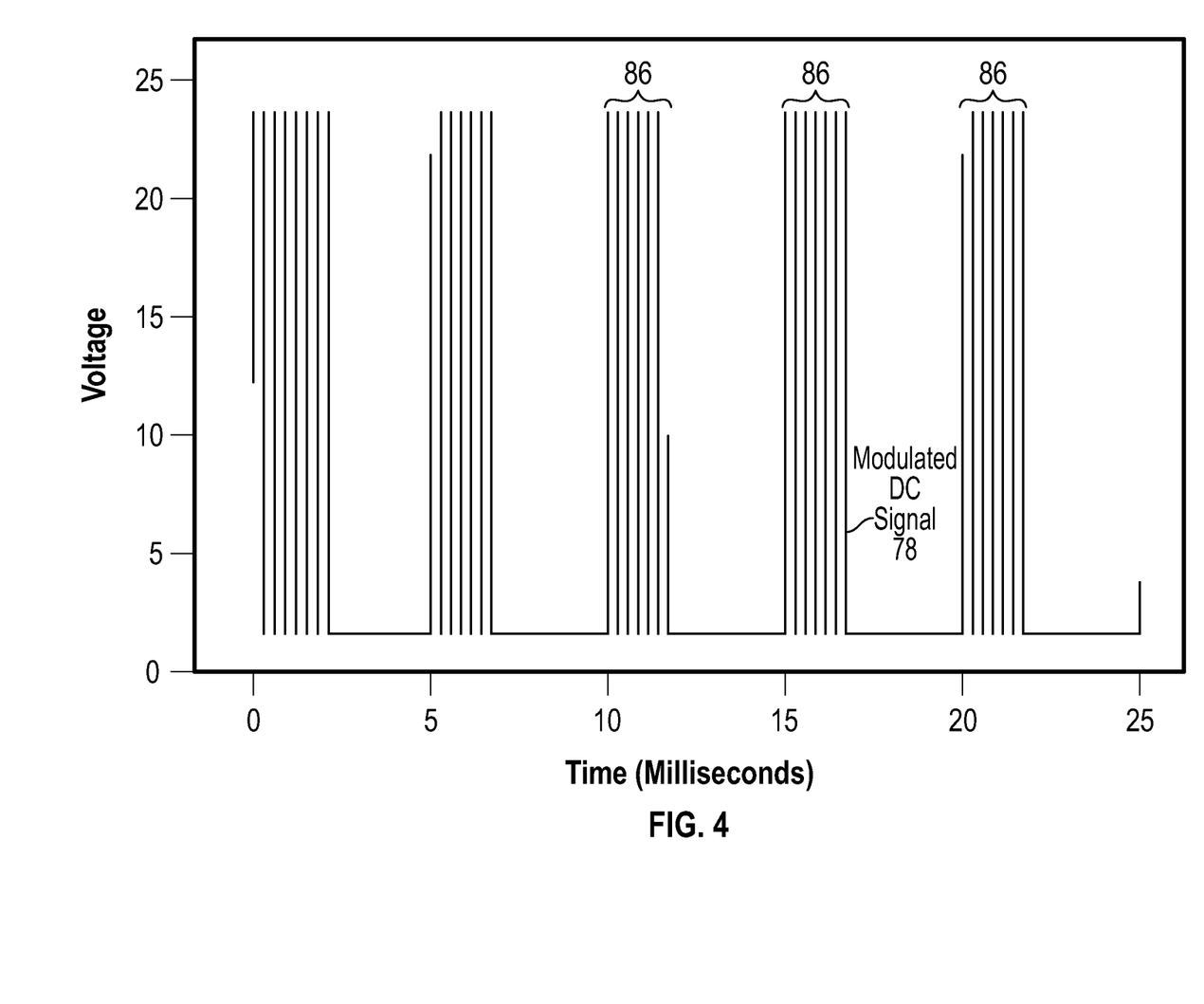
FIG. 4 is a graph illustrating the modulated DC signal where a frequency component is introduced, according to an exemplary embodiment.

Referring to FIGS. 2, 3, and 4, the driver circuit 68 may be any device configured to generate the driving signals 82 that cause the modulation circuit 64 to introduce the frequency component 84 into the modulated DC signal 78. Referring to FIGS. 2 and 3, the frequency component 84 is introduced into each of the ON portions 86 of the modulated DC signal 78.

The modulation circuit 64 is any device configured to introduce the frequency component 84 into the modulated DC signal 78. The modulation circuit 64 and the driver circuit 68 may be implemented using either analog or digital components. Some examples of circuitry that may be used as the modulation circuit 64 include, but are not limited to, a half bridge circuit or a digital to analog converter coupled to a power amplifier having an output capability of at least 100 Watts. In one example, the driver circuit 68 is half-bridge driver implemented using analog components. As mentioned above, the frequency component 84 introduced into the modulated DC signal 78 is representative of the set frequency of the primary AC voltage signal 40. The frequency component 84 introduced into the modulated DC signal 78 is at least two orders of magnitude greater than the PWM frequency of the modulated DC signal 78.

Figure 5:
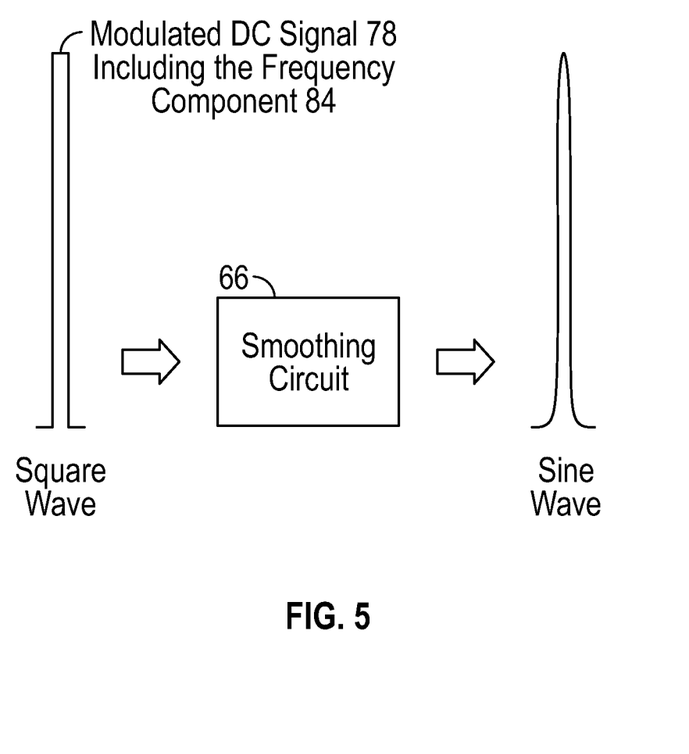
FIG. 5 is an enlarged view of a portion of the modulated DC signal shown in FIG. 4, where the modulated DC signal is transformed into a sine wave, according to an exemplary embodiment.

Referring to FIG. 2, the modulation circuit 64 is in electronic communication with the smoothening circuit 66. The modulation circuit 64 sends the modulated DC signal 78 including the frequency component 84 to the smoothening circuit 66. The smoothening circuit 66 is configured to remove higher frequency harmonics from the modulated DC signal 78 including the frequency component 84. FIG. 5 is an enlarged view of a portion of the modulated DC signal 78 including the frequency component 84 shown in FIG. 4. As seen in FIG. 5, the modulated DC signal 78 including the frequency component 84 is a square wave signal. The smoothing circuit 66 receives the modulated DC signal 78 including the frequency component 84, which is square wave signal, and transforms the modulated DC signal 78 including the frequency component 84 into a sine wave signal. Referring back to FIG. 2, the smoothening circuit 66 then outputs the primary AC voltage signal 40. Referring to both FIGS. 1 and 2, the primary AC voltage signal 40 is then sent to the flyback transformer 24, which transforms the primary AC voltage signal 40 into the secondary AC voltage signal 42.

Figure 6:
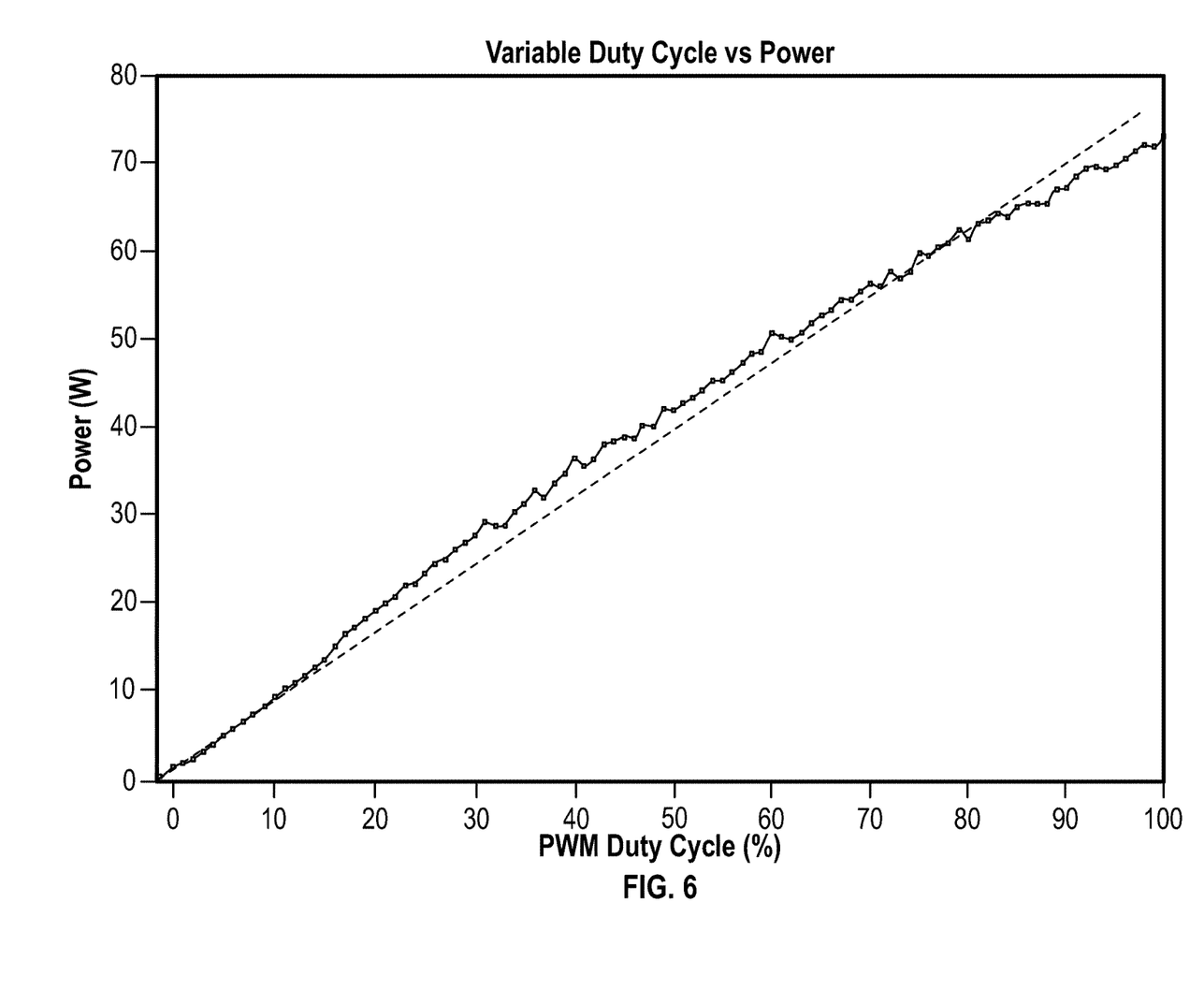
FIG. 6 is a graph illustrating a relationship between a variable duty cycle of an AC voltage signal generated by the control circuit and the power supplied to the DBD disk, according to an exemplary embodiment.
Figure 7:
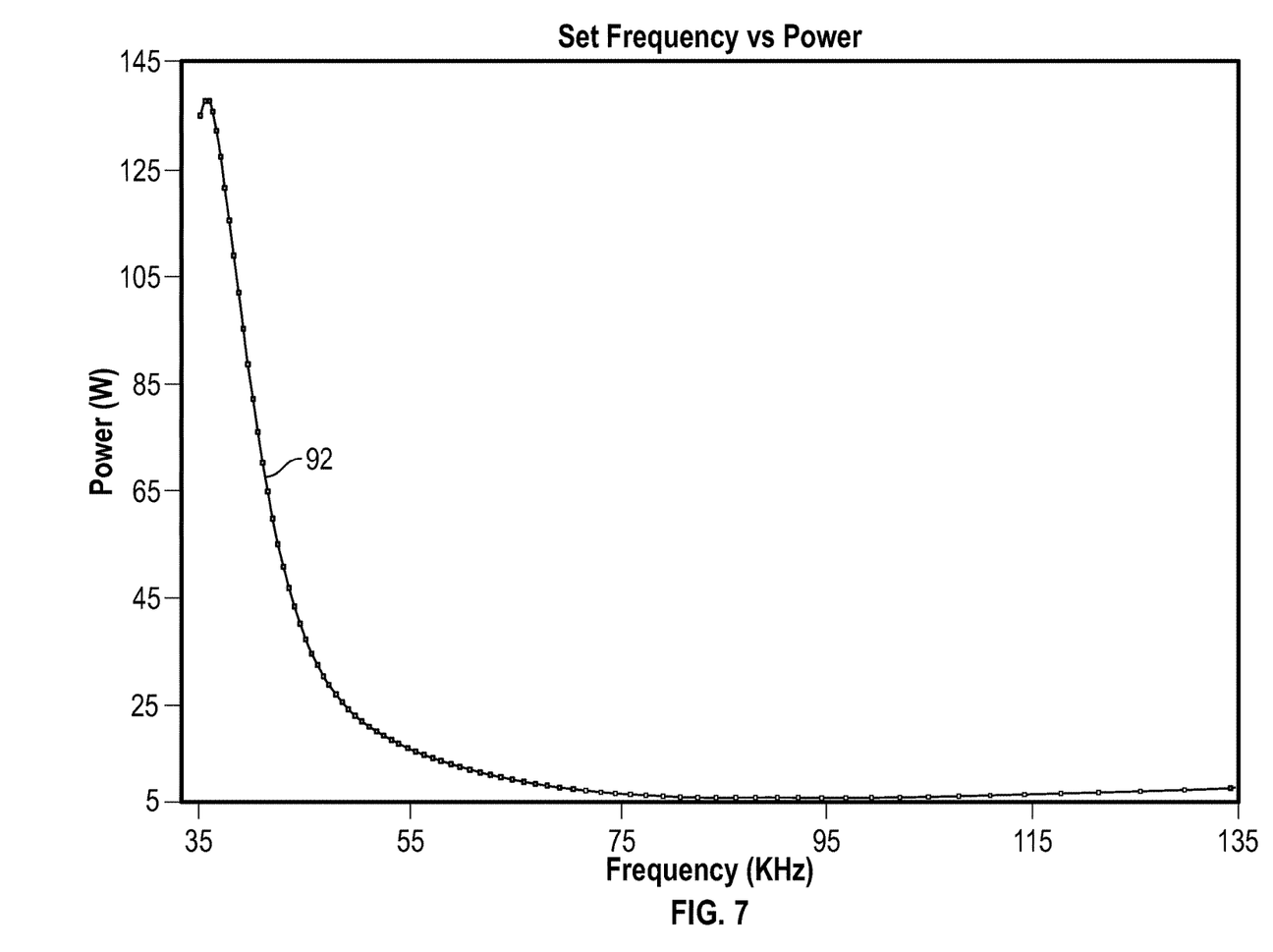
FIG. 7 is a graph illustrating a relationship between a set frequency of the AC voltage signal generated by the control circuit and the power supplied to the DBD disk, according to an exemplary embodiment.

As mentioned above, the amount of power generated by the DBD disk 26 is based on the set frequency and the variable duty cycle of the primary AC voltage signal 40. FIG. 6 is an illustration of an exemplary relationship between the amount of power provided to the DBD disk 26 and the variable duty cycle of the primary AC voltage signal 40. As seen in FIG. 6, a linear relationship 90 exists between the amount of power provided to the DBD disk 26 and the variable duty cycle. Specifically, the power provided to the DBD disk 26 increases as the variable duty cycle increases from zero percent to one hundred present. FIG. 7 is an illustration of an exemplary relationship between the amount of power provided to the DBD disk 26 and the set frequency. As seen in FIG. 7, there is a non-linear, asymptotic relationship 92 between the amount of power provided to the DBD disk 26 and the set frequency. Specifically, as the frequency increases, the amount of power provided to the DBD disk 26 decreases in an asymptotic manner. Referring generally to FIGS. 1, 5, and 7, it is to be appreciated that since the relationship between the variable duty cycle and the amount of power provided to the DBD disk 26 is linear, the variable duty cycle provides fine or granular control over the power provided the DBD disk 26.

Referring generally to the figures, the disclosed control circuit provides various technical effects and benefits. Specifically, the disclosed control circuit provides a relatively compact and simple approach for controlling the amount of power supplied to the DBD disk of a three-dimensional printer. The control circuit controls both the duty cycle and the frequency of the AC voltage signal that is provided to the DBD disk. In particular, controlling the duty cycle of the AC voltage signal provides fine control over the amount of power supplied to the DBD disk.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A control circuit for generating a primary alternating current (AC) voltage signal provided to a dielectric barrier discharge (DBD) disk of a three-dimensional printer, the control circuit comprising:
   a switching regulator receiving a direct current (DC) voltage signal, wherein the switching regulator modulates the DC voltage signal based on a variable duty cycle to create a modulated DC signal; and
   a modulation circuit in electrical communication with the switching regulator, the modulation circuit introducing a frequency component to the modulated DC signal, wherein the primary AC voltage signal includes a variable duty cycle and a set frequency, and wherein the frequency component introduced into the modulated DC signal is representative of the set frequency of the primary AC voltage.

2. The control circuit of claim 1, further comprising:
a controller in electronic communication with the switching regulator, wherein the controller sends a value indicating the variable duty cycle to the switching regulator.

3. The control circuit of claim 2, wherein the variable duty cycle is expressed by a pulse width modulation (PWM) signal including a percentage and a PWM frequency.

4. The control circuit of claim 3, wherein the frequency component introduced into the modulated DC signal is at least two orders of magnitude greater than the PWM frequency of the modulated DC signal.

5. The control circuit of claim 2, further comprising a driver circuit and a modulation circuit, wherein the driver circuit is in electronic communication with the controller and the modulation circuit.

6. The control circuit of claim 5, wherein the modulation circuit is a half bridge circuit and the driver circuit is a half-bridge driver.

7. The control circuit of claim 5, wherein the driver circuit sends an enable signal and a frequency tuning value to the modulation circuit.

8. The control circuit of claim 7, wherein the enable signal instructs the modulation circuit to either start or stop operation.

9. The control circuit of claim 7, wherein the frequency tuning value instructs the driver circuit to generate driving signals that cause the modulation circuit to introduce a frequency component into the modulated DC signal.

10. The control circuit of claim 1, further comprising a smoothening circuit in electronic communication with the modulation circuit.

11. The control circuit of claim 1, wherein set frequency of the primary AC voltage signal is a static value that remains constant for a print cycle of the three-dimensional printer.

12. The control circuit of claim 1, wherein the variable duty cycle is adjustable during a print cycle of the three-dimensional printer.

13. A three-dimensional printer, comprising:
a DBD disk configured to generate plasma;
a flyback transformer in electrical communication with the DBD disk; and
a control circuit configured to generate a primary AC voltage signal sent to the flyback transformer, wherein the flyback transformer transforms the primary AC voltage signal into a secondary AC voltage signal that is sent to the DBD disk, and wherein the control circuit comprises:
a switching regulator receiving a DC voltage signal, wherein the switching regulator modulates the DC voltage signal based on a variable duty cycle to create a modulated DC signal; and
a modulation circuit in electrical communication with the switching regulator, the modulation circuit introducing a frequency component to the modulated DC signal, wherein the primary AC voltage signal includes a variable duty cycle and a set frequency, and wherein the frequency component introduced into the modulated DC signal is representative of the set frequency of the primary AC voltage.

14. The three-dimensional printer of claim 13, wherein the control circuit further comprises:
a controller in electronic communication with the switching regulator, wherein the controller sends a value indicating the variable duty cycle to the switching regulator.

15. The three-dimensional printer of claim 14, wherein the variable duty cycle is expressed by a pulse width modulation (PWM) signal including a percentage and a PWM frequency.

16. The three-dimensional printer of claim 15, further comprising a driver circuit and a modulation circuit, wherein the driver circuit is in electronic communication with the controller and the modulation circuit.

17. The three-dimensional printer of claim 16, wherein the driver circuit sends an enable signal and a frequency tuning value to the modulation circuit.

18. The three-dimensional printer of claim 17, wherein the enable signal instructs the modulation circuit to either start or stop operation.

19. The three-dimensional printer of claim 17, wherein the frequency tuning value instructs the driver circuit to generate driving signals that cause the modulation circuit to introduce a frequency component into the modulated DC signal.

20. The three-dimensional printer of claim 13, wherein set frequency of the primary AC voltage signal is a static value that remains constant for a print cycle of the three-dimensional printer and the variable duty cycle is adjustable during the print cycle of the three-dimensional printer.

* * * * *